US00RE36710E

United States Patent [19]

Baets et al.

[11] E Patent Number: Re. 36,710

[45] Reissued Date of Patent: May 23, 2000

[54] INTEGRATED TUNABLE OPTICAL FILTER

[75] Inventors: Roel Baets, Deinze; Jan Willems, Gentbrugge, both of Belgium

[73] Assignee: Interuniversitair Micro-Elektronica Centrum VZW, Belgium

[21] Appl. No.: 09/118,474

[22] Filed: Jul. 17, 1998

Related U.S. Patent Documents

Reissue of:

[64] Patent No.: 5,621,828
Issued: Apr. 15, 1997
Appl. No.: 05/635,057
Filed: Apr. 19, 1996

U.S. Applications:

[ 63] Continuation of application No. 08/244,110, filed as application No. PCT/BE93/00061, Sep. 17, 1993, abandoned.

[30] Foreign Application Priority Data

Sep. 14, 1992 [BE] Belgium ..... 09200838

[51] Int. Cl.[7] ..... G02B 6/12; G02F 1/295

[52] U.S. Cl. ..... 385/14; 385/8; 385/10; 385/37; 372/50

[58] Field of Search ..... 385/2, 3, 8, 10, 385/14, 27, 37; 372/20, 50, 102; 359/566, 569

[56] References Cited

U.S. PATENT DOCUMENTS

| | | | |
|---|---|---|---|
| 4,743,087 | 5/1988 | Utaka et al. | 385/8 |
| 4,976,513 | 12/1990 | Numal | 359/569 |
| 5,147,825 | 9/1992 | Koch et al. | 437/228 |
| 5,189,714 | 2/1993 | Okayama et al. | 385/27 |
| 5,220,573 | 6/1993 | Sakata et al. | 372/50 |
| 5,253,314 | 10/1993 | Alferness et al. | 385/40 |
| 5,325,392 | 6/1994 | Tohmori et al. | 372/96 |
| 5,416,866 | 5/1995 | Sahlen | 385/37 |

FOREIGN PATENT DOCUMENTS 4-79287 3/1992 Japan .

OTHER PUBLICATIONS

Alferness et al, "Broadly tunable InGaAsP/InP buried rib waveguide vertical coupler filter", Appl. Phys. Lett. 60(8), pp. 980–982, Feb. 1992.

Yayaraman et al, "Demonstration of broadband tunability in a semiconductor laser using sampled gratings", Appl. Phys. Lett. 60(19), pp. 2321–2323, May 1992.

Olsson et al, "Performance characteristics of a 1.5 um single frequency semiconductor laser with an external waveguide Bragg reflector", IEEE J. of Quantum Elec., vol. 24, No. 2, pp. 143–147, Feb. 1988.

Hirata et al, "Monolithic resonant optical reflector laser diodes", Electronics Letters, vol. 27, No. 22, pp. 2050–2051, Oct. 1991.

Jayarman et al. "Demonstration of broadband tunability in a semiconductor laser using sampled gratings", Appl. Phys. Lett. 60(19), pp.2321–2323 May 1992.

(List continued on next page.)

*Primary Examiner*—Hemang Sanghavi
*Attorney, Agent, or Firm*—McDonnell, Boehnen, Hulbert & Berghoff

[57] ABSTRACT

An integrated tunable optical filter comprising a substrate made of a semiconducting material. The substrate includes first and second sections. The first section forms a tunable transmission filter, based on a codirectional coupler having a low selectivity. The second section forms a reflection filter with a reflection spectrum containing a number of peaks. A first injector, designed for current injection into said first section, is provided. Thus, the filter response of the first section is shifted in wavelength over a large wavelength range. There is also a second injector, designed for current injection into the second section. As a result, the reflective spectrum of the second section is slightly shifted in wavelength, in such a way that one reflection peak of the reflection spectrum corresponds to the coupling wavelength of the first section. Consequently, the total filter response has a very narrow bandwidth and wide tunability.

7 Claims, 2 Drawing Sheets

OTHER PUBLICATIONS

Willems et al, "Novel widely tunable integrated optical filter with high spectral selectivity", 18th European Conference on Optical Communication Oct. 1992.

Willens et al, Novel widley tunable integrated optical filter with high spectral selectivity, 18th European Conference on Optical Communication, Oct. 1992.

IEEE Photonics Technology Letters, vol. 5, No. 7, Jul. 1993, M. Oberg et al, "74 mm wavelength tuning range of an InGaAsP/InP vertical grating assisted codirectionsl coupler laser . . . " (p. 735).

INTEGRATED TUNABLE OPTICAL FILTER

Matter enclosed in heavy brackets [ ] appears in the original patent but forms no part of this reissue specification; matter printed in italics indicates the additions made by reissue.

This application is continuation application of Ser. No. 08/244,110, as PCT/BE93/00061, Sep. 17, 1993 published as WO94/07178, Mar. 31, 1994, now abandoned.

BACKGROUND OF THE INVENTION

The invention relates to an integrated broadly tunable optical filter designed, in particular, for advanced WDM (Wavelength Division Multiplexing) applications as well as for use in spectroscopic testing of various optical components.

Broadly tunable optical filters are key components in optical communication systems. Two objectives dominate with such filters. The aims, on the one hand, are a broad tunable range and, on the other hand, high spectral selectivity. The planar integrated structures known hitherto, however, permit only one of these objectives at a time to be met.

A conventional filter structure, known as co-directional coupler structure, is described in "Broadly tunable InGaAsP/InP buried rib waveguide vertical coupler filter" (R. C. Alferness, L. L. Buhl, U. Koren, B. I. Miller, M. G. Young, T. L. Koch, G. A. Burrus, G. Raybon), Appl. Phys. Lett. 60(8), 24 Feb. 1992. This conventional structure consists of two asymmetrical waveguides having different effective refractive indices. The optical signal launched into the uppermost waveguide is launched into the lowermost waveguide and selectively reflected towards the uppermost waveguide. If the parameters of the waveguides are chosen carefully, a structure of this type can act as a selective filter.

The advantage of this conventional structure is the fact that a broad tuning range is provided, but it is difficult to obtain high spectral selectivity without constructing a long appliance.

On the other hand, a semiconductor optical structure is also known which can provide high selectivity. This conventional structure makes use of a waveguide having a grating grown thereon, that grating of which is periodically omitted. A structure of this type has already been used in a tunable laser (V. Jayaraman, D. A. Cohen, L. A. Coldten, "Demonstration of broadband tunability in a semiconductor laser using sampled gratings", Appl. Phys. Lett 60(19), 11 May 1992). Nevertheless, a structure of this type has hitherto not been used in a filter structure.

This conventional structure provides a comb-shaped reflection spectrum. The parameters thereof are the spacing between the peaks, the spectral bandwidth of the envelope of the comb spectrum, the peak maximums and the bandwidth of a reflection peak. The latter is probably the most important parameter, because it affects the selectivity of the structure. Most unfortunately, this parameter too limits the tuning range of the structure.

SUMMARY OF THE INVENTION

The object of the present invention is to present an optical filter structure which provides, at the same time, a large tuning range and high spectral selectivity in a compact integrated appliance.

In order to accomplish the abovementioned objective, the present invention makes provision for an integrated optical filter which comprises a semiconductor substrate having a common electrode on a first side thereof, the substrate comprising a first waveguide on which a grating is grown, said grating comprising a first part having a large period and a second part having a small period, from which said grating is periodically omitted. At the top of said first grating section and at a distance therefrom, a second waveguide extends in such a way that there is formed, in a first section of the substrate, a codirectional coupler section. Said second waveguide is covered by a semiconductor part whose topside carries a second electrode. Provided on the topside of the substrate at the top of the second grating section there is a third electrode. The refractive indices of both waveguides in the first section are controlled by current injection along said second electrode. The refractive index of the waveguide in the second section is controlled by current injection along said third electrode.

BRIEF DESCRIPTION OF THE DRAWINGS

The invention will be explained in more detail with reference to the drawing, in which FIG. 1 diagrammatically represents a cross section of the structure according to the invention.

DETAILED DESCRIPTION

Figure 1:
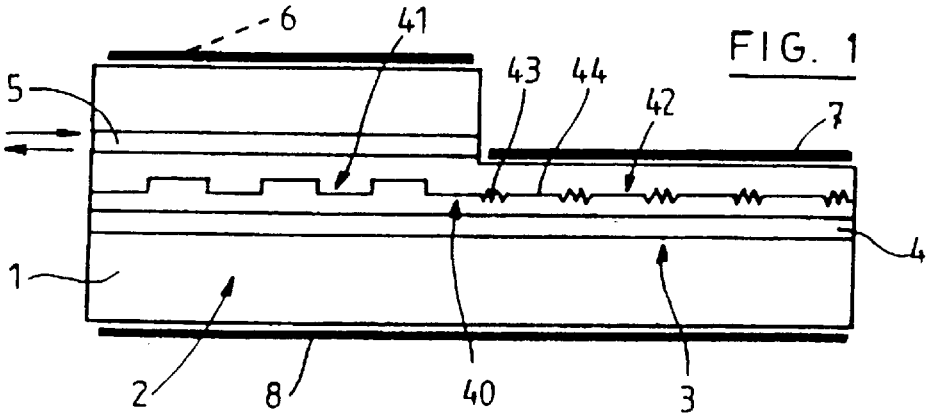

FIG. 1 shows an optical filter structure according to the invention. The integrated filter structure mainly comprises substrate 1 made of semiconductor material, for example InP, in which two sections 2 and 3 are formed. On the substrate a number of layers are grown from semiconductor material, for example InGaAsP, which form the lowermost waveguide 4 having a grating 40 grown thereon. Said grating 40 is grown so as to have two different geometrical structures, namely a first rib-shaped structure 41 having a long period in said first section 2, and a second periodically broken sawtooth-shaped or stripe-shaped structure 42 in said second section 3. The last mentioned sawtooth-shaped structure 42 is formed so as to have short-period striped regions 43 and alternating non-striped regions 44. Typical values for the period of the rib-shaped structure range between 10 and 50 $\mu$m, inclusive. Typical values for the period of the sawtooth-shaped structure are below 1 $\mu$m.

At the top of the first rib-shaped structure 41, and at a distance thereof, an uppermost waveguide 5 extends in such a way that there is formed, in the first second 2 of the substrate, a codirectional coupler section. On the topside of the first section 2 there is provided a first electrode 6, by means of which current injection can be coupled in into said first section. On the topside of the second section 3, too, a second electrode 7 is provided by means of which current injection can be coupled in into said second section. A common back electrode 8 is provided on the underside of the substrate.

An appliance according to the invention works as follows. An optical signal is passed into the uppermost waveguide 5, and at a certain wavelength $\lambda$, 100% of the optical power is coupled across to the lowermost waveguide 4. The spectral bandwidth of the codirectional coupler in section 2 is determined by the length $L_{codir}$ of said section 2, the period of the rib-shaped structure 41 and the effective refractive indices $n_2$, and $n_b$ of the two waveguides 5 and 4, respectively, according to the following relationship:

$$\Delta\lambda_{3db} = 0.8\frac{\Lambda}{L_{codir}1-\Lambda}\frac{\lambda}{\frac{\partial}{\partial\lambda}(n_b - n_a)}$$

Figure 2:
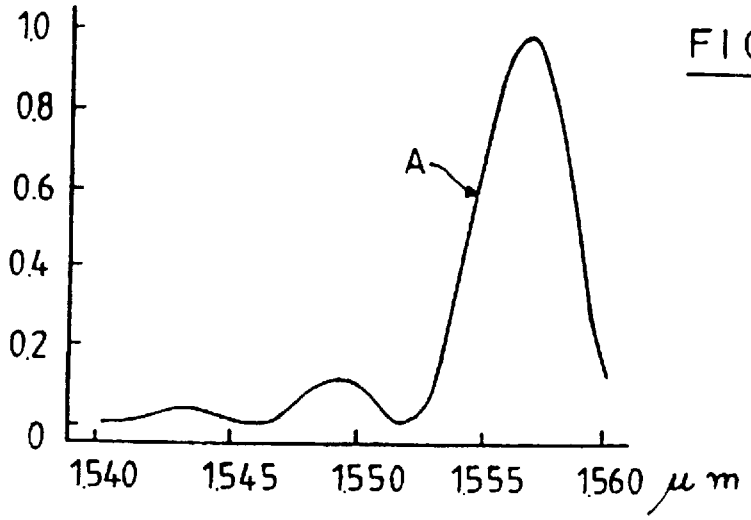
FIGS. 2 to 6 inclusive represent curves, by way of example, which illustrate the operation of the filter structure of FIG. 1.
Figure 3:
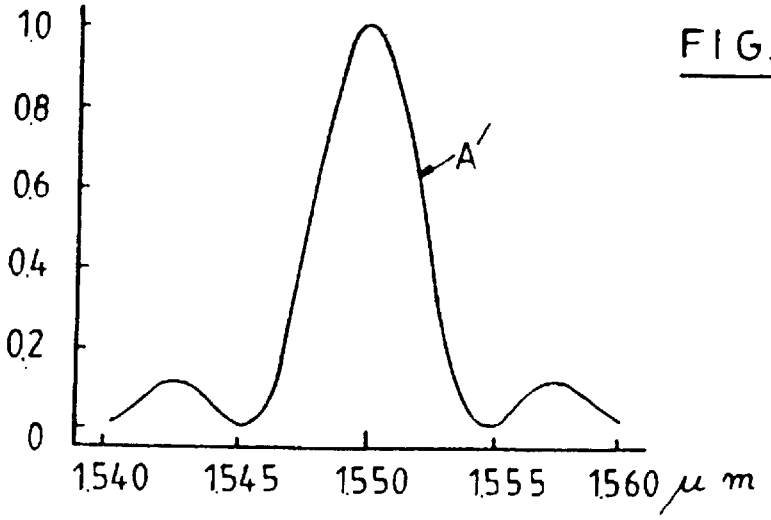

Said coupled wavelength can be altered by varying the refractive indices $n_a$ and $n_b$ based on current injection by applying a voltage between electrodes 6 and 8. FIG. 2 represents an example of a filter response A of a codirectional coupler, and FIG. 3 represents the same filter response A', but shifted in wavelength by current injection. It should be noted that the filter response in section 2 has a low selectivity.

Figure 4:
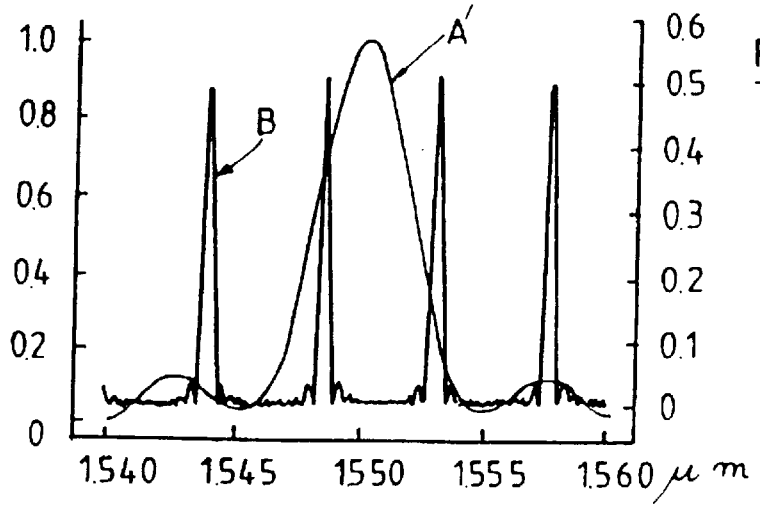

The optical signal which was coupled to the lowermost waveguide 4 ends up in the broken sawtooth-shaped structure 42. The reflection spectrum of said structure is comb-shaped as shown by B in FIG. 4, together with the filter response of the first section. The reflection peaks of the comb spectrum have a high selectivity. The selectivity is mainly determined by the number of periods in the broken structure 42 and the coupling strength of that structure.

Figure 5:
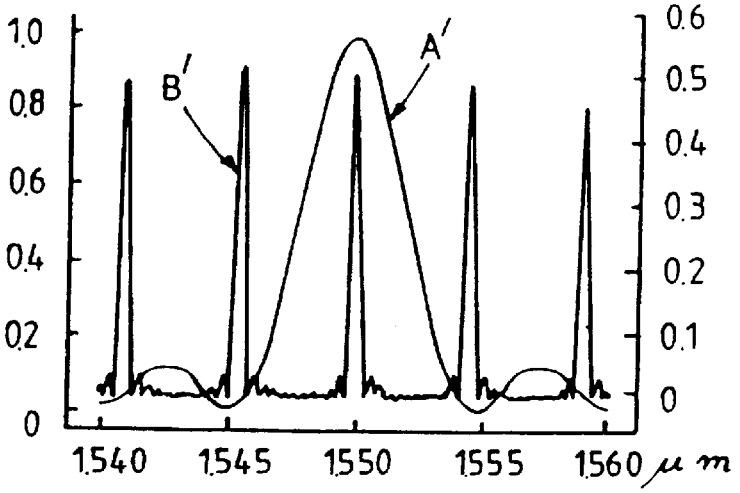

The reflection peaks of the comb spectrum B can be changed slightly by current injection in said section when a voltage is applied between electrodes 7 and 8. Thus the Comb spectrum is slightly shifted in wavelength as shown by B' in FIG. 5. Thus it is possible to ensure that the wavelength of one of the reflection peaks corresponds to the central coupling wavelength of the first section 2.

Figure 6:
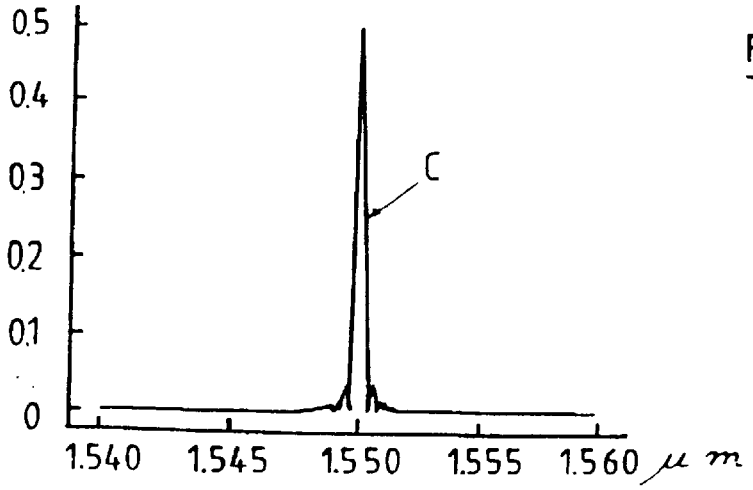

This results in a filter response C having a very narrow bandwidth as shown in FIG. 6, which response is launched into the uppermost waveguide 5 and supplied to the output thereof.

The parameters of the two sections 2 and 3 cannot be chosen totally independently of one another, but must satisfy at least the following condition. This condition establishes a relationship between the spectral bandwidth of the codirectional coupler and the spacing between the peaks in the comb spectrum of section 3. This bandwidth must be smaller than the spacing between the peaks:

$$\Delta\lambda_{3db} < \frac{\lambda^2}{2n(L_1 + L_2)}$$

where $\Delta\lambda_{3db}$ is the spectral bandwidth of the codirectional coupler:

$$\Delta\lambda_{3db} = 0.8\frac{\Lambda}{L_{codir}1-\Lambda}\frac{\lambda}{\frac{\partial}{\partial\lambda}(n_b - n_a)}$$

where:

- $\lambda$ is the wavelength,
- $\Delta$ is the period of the rib-shaped structure in the first section
- $L_{codir}$ is the length of the first section
- $n_a$, $n_b$ are the effective refractive indices of the two waveguides in the first section,
- $L_1$ is the length of the sawtooth-shaped structure grating in one period of the second section,
- $L_2$ is the length of the non-striped portion of the grating structure in one period of the second section,
- n is the effective refractive index of the waveguide in the second section.

Furthermore, the choice of the parameters is also restricted by the properties required of the overall structure. Two important properties are the magnitude of the tuning range and the selectivity. The tuning range is determined by both sections and is no greater than the maximum of two variables, namely $\Delta\lambda_1$, the tuning range of the codirectional structure, and $\Delta\lambda_2$, the spectral bandwidth of the envelope of the comb spectrum at the second section 3.

$$\Delta\lambda_1 = \Lambda\frac{\Delta(n_b - n_a)}{1-\Lambda\frac{\partial}{\partial\lambda}(n_b - n_a)\times\Lambda\Delta\frac{\partial}{\partial\lambda}(n_b - n_a)}$$

$$\Delta\lambda_2 = \frac{1\lambda^2}{L_1\pi n}\sqrt{2}$$

Typical values in one illustrative embodiment in an InGaAsP substrate:

| | |
|---|---|
| Codirectional coupler section | |
| Length $L_{coupler}$ | 900 $\mu$m |
| | 3.210 |
| | 3.307 |
| Å | 16 $\mu$M |
| Coupling coefficient | 17.5 $cm^{-1}$ |
| Broken sawtooth-shaped structure | |
| Length | 900 $\mu$m |
| $N_{eff}$ | 3.24 |
| $L_1$ | 75 $\mu$m |
| $L_2$ | 7.5 $\mu$m |
| | 0.2413 $\mu$m |
| Coupling coefficient | 10 $cm^{-1}$ |
| Filter response | |
| Central wavelength | $\lambda$ = 1.550 $\mu$m |
| Tuning range | 50 nm |
| Change of refractive index | 0.3 nm |

We claim:

1. An integrated tunable optical filter comprising:

a substrate made of semiconducting material, a first section on said substrate forming a transmission filter having a low spectral selectivity, said first section including a first waveguide system with upper and lower waveguides, a periodic rib shaped structure [between said upper and lower] *adjacent at least one of said* waveguides defining a filter response with a central coupling wavelength, and a second section on said substrate forming a reflector with a spectral reflection with a plurality of reflection peaks, said second section including a second waveguide coupled with said [lower] *first* waveguide *system* in said first section and having a periodically broken short-period reflection structure including short period stripped regions alternating with non-stripped regions;

first means for injecting current into said first section, said filter response of said first section being shifted in wavelength over a range covering a plurality of said reflection peaks of said second section; and second means for injecting current into said second section, said reflection spectrum of said second section being shifted in wavelength and one reflection peak of said plurality of reflection peaks corresponding to said central coupling wavelength of said first section;

wherein said optical filter has a reflection response [in said upper waveguide] with a narrow bandwidth and wide tunability.

2. An optical filter according to claim 1, wherein said [second] *first* and second waveguides are formed in a single layer interface.

3. An optical filter according to claim 1, wherein said first section forms a codirectional optical coupler.

4. An optical filter according to claim 3, wherein said short-period reflection structure and said rib-shaped structure are formed in a single layer interface.

5. An optical filter according to claim 3, wherein said rib-shaped structure has a period of 10–50 $\mu$m.

6. An optical filter according to claim 5, wherein said short-period reflection structure is sawtooth-shaped.

7. An optical filter according to claim 5, wherein said short-period reflection structure and said rib-shaped structure each have a period and wherein said short period reflection structure has a period less than said period of said rib-shaped structure.

* * * * *